United States Patent [19]
Higashi et al.

[11] Patent Number: 5,895,233
[45] Date of Patent: *Apr. 20, 1999

[54] INTEGRATED SILICON VACUUM MICROPACKAGE FOR INFRARED DEVICES

[75] Inventors: Robert E. Higashi, Shorewood; Jeffrey A. Ridley, Burnsville; Thomas G. Stratton, Roseville; R. Andrew Wood, Bloomington, all of Minn.

[73] Assignee: Honeywell Inc., Minneapolis, Minn.

[*] Notice: This patent issued on a continued prosecution application filed under 37 CFR 1.53(d), and is subject to the twenty year patent term provisions of 35 U.S.C. 154(a)(2).

[21] Appl. No.: 08/939,960
[22] Filed: Sep. 29, 1997

Related U.S. Application Data

[63] Continuation of application No. 08/715,115, Sep. 18, 1996, abandoned, which is a continuation of application No. 08/507,796, Jul. 26, 1995, abandoned, which is a continuation of application No. 08/166,492, Dec. 13, 1993, abandoned.

[51] Int. Cl.⁶ .......................................... H01L 21/44
[52] U.S. Cl. ............................... 438/107; 458/108
[58] Field of Search .......................... 257/21, 444, 737, 257/777, 778, 779, 780, 227, 293, 749, 433, 434; 250/338.1; 438/107, 108, 109

[56] References Cited

U.S. PATENT DOCUMENTS

| | | | |
|---|---|---|---|
| 3,577,037 | 5/1971 | Di Pietro | 257/777 |
| 3,973,146 | 8/1976 | Arnold et al. | 257/227 |
| 4,122,479 | 10/1978 | Sugawara et al. | 257/777 |
| 4,369,458 | 1/1983 | Thomas et al. | 257/777 |
| 4,555,720 | 11/1985 | Readhead | 257/777 |
| 4,784,970 | 11/1988 | Solomon | 257/777 |
| 5,006,711 | 4/1991 | Hamashima et al. | 250/349 |
| 5,318,666 | 6/1994 | Eklind et al. | 156/643 |
| 5,397,897 | 3/1995 | Komatsu et al. | |
| 5,521,123 | 5/1996 | Komatsu et al. | |

FOREIGN PATENT DOCUMENTS

| | | |
|---|---|---|
| 0453372 | 10/1991 | European Pat. Off. |
| 2121598 | 12/1983 | United Kingdom |

OTHER PUBLICATIONS n-p-n Silicon Lateral Phototransistors for Hybrid Integrated Optical Circuits, Huang et al., IEEE vol. 6D-33, No. 4, Apr. 1986.

*Primary Examiner*—Kevin M. Picardat
*Attorney, Agent, or Firm*—Ian D. MacKinnon

[57] ABSTRACT

An efficient method brings together two wafers of dies that contain an infrared transparent window or top cap with either an infrared detector or emitter array to produce a low cost infrared package. A low thermal conductivity gas or a vacuum may be used between the wafers for enhanced thermal isolation. Joining of the wafers is preferably by solder, although ultrasonic bonding can be used.

4 Claims, 4 Drawing Sheets

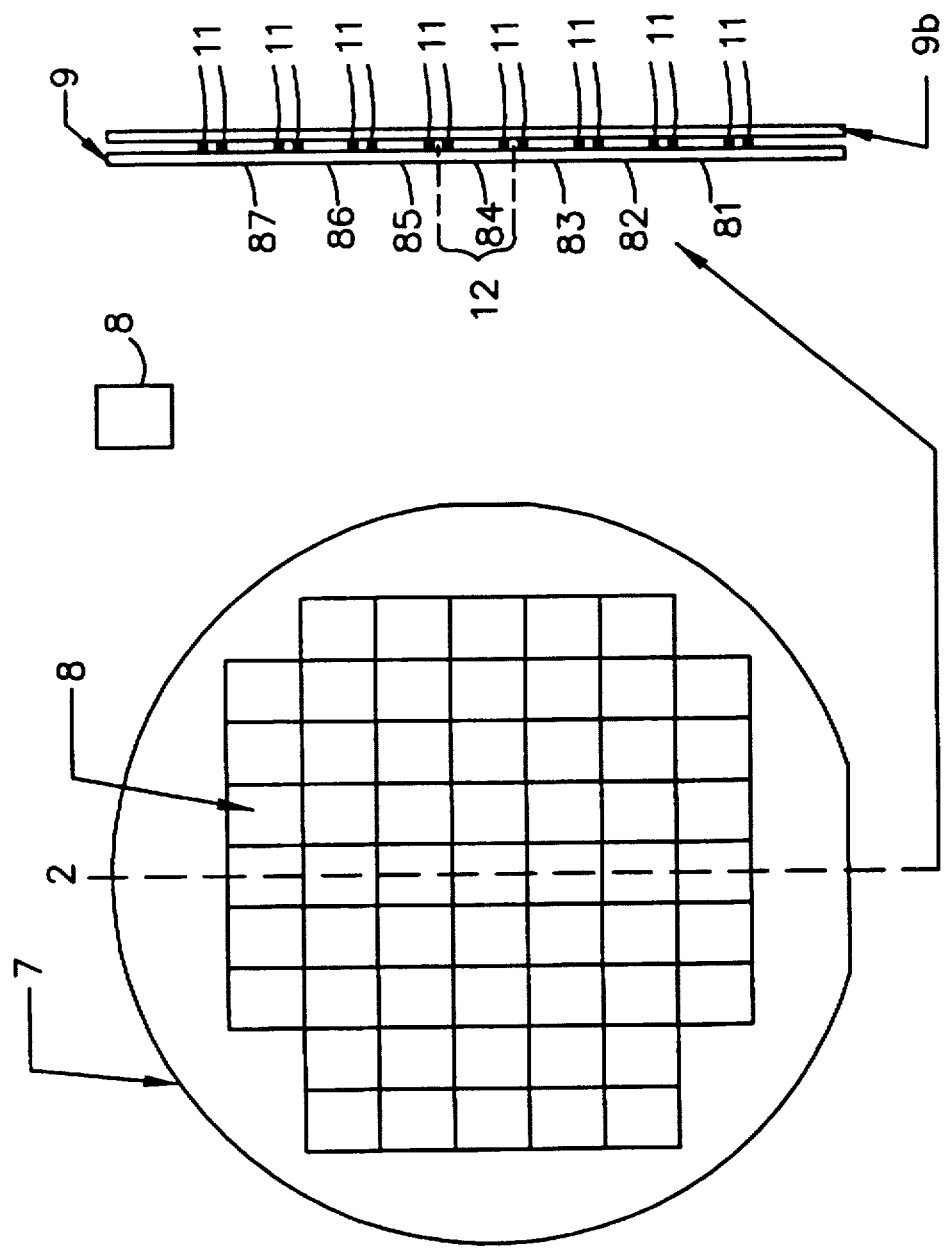

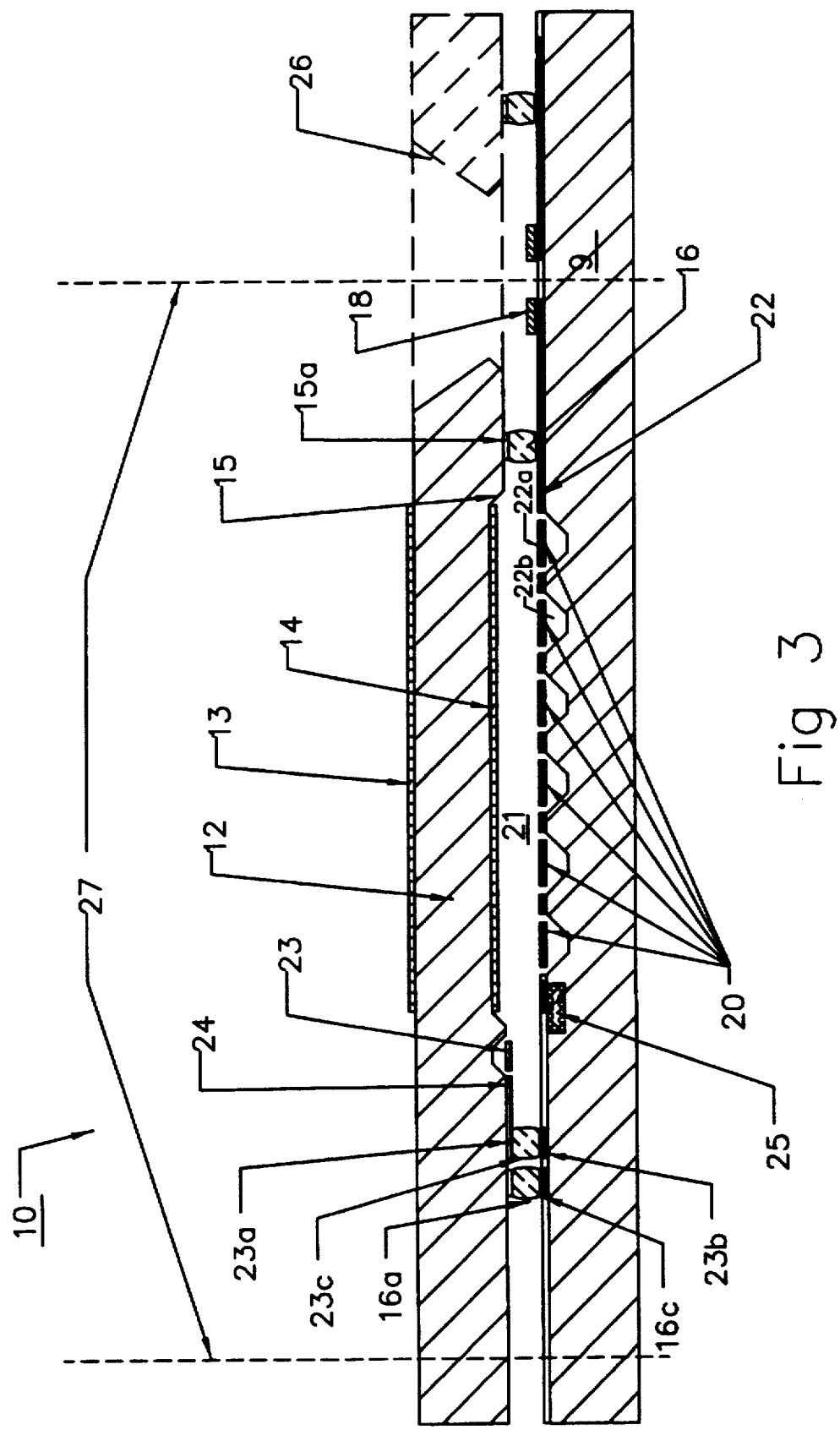

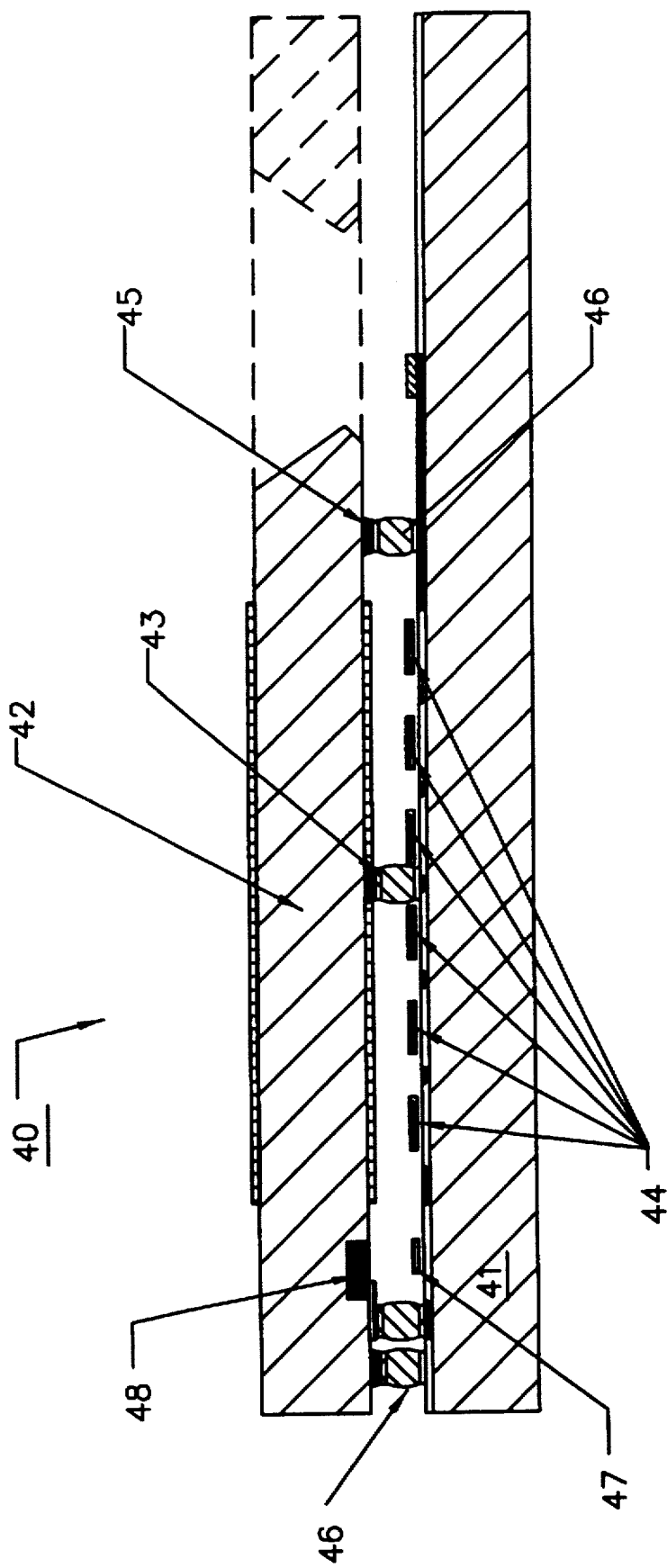

INTEGRATED SILICON VACUUM MICROPACKAGE FOR INFRARED DEVICES

This application is a continuation of application Ser. No. 08/715,115, filed Sep. 18, 1996, now abandoned, which is a continuation of application Ser. No. 08/507,796, filed Jul. 26, 1995, now abandoned, which is a continuation of application Ser. No. 08/166,492, filed Dec. 13, 1993, now abandoned.

This application relates to the field of infrared sensing and infrared scene projection or emission, and particularly to the packaging of arrays of small elements thereof.

BACKGROUND

Thermal isolation is very important for thermal based infrared devices (detector or emitters), as opposed to quantum detectors or emitters, since the detection or transmission of infrared radiation is directly related to the temperature rise achieved by the detector or emitters of the device. The better the thermal isolation of the detector or emitters the more efficient the device will be at converting radiation to heat (detector) or heat to radiation (emitter). Vacuum packaging is a very effective means to improve performance. It reduces heat flow from individual infrared units to their neighbors and/or to surrounding surfaces via ambient gas molecules by eliminating such molecules.

Because microstructure infrared detector and emitter arrays are very small and fragile, common silicon production and packaging techniques may not be suitable for large scale production of these array bearing devices. Typical infrared units in the arrays are built to be thermally isolated from the chip, as well as their neighbors, thus having elements suspended apart from the substrate to enhance the thermal isolation by having the minimal physical contacts possible. These bridges or suspension structures can be particularly fragile, therefore the method of encapsulating them into a vacuum can be critical to device yield rates.

A method for packaging the die in a batch process substantially improves the yield, reduces the cost and at the same time achieves maximum performance of these devices. This type of packaging is necessary to mass produce low cost, thermally based infrared devices. The proposed package is termed a "micropackage."

Maintaining an effective vacuum in a sealed package is often challenging due to surface outgassing. Frequently heat treatments will minimize this but such outgassing determines the effective life of the device unless it can be periodically or continuously removed. Integrating a getter into each discrete chip would be a method of maintaining a good vacuum for all chips as the getter will counteract the outgassing generated by the package surfaces.

The innovative structures taught here provide tremendous cost savings over prior designs for packaging these devices, the capability of achieving much smaller packages, as well as having the potential to greatly increase packaged device yield for lower cost.

BRIEF DESCRIPTION OF THE DRAWINGS

FIG. 1 is a plan view of a wafer level design employed by a preferred embodiment of the invention.

FIG. 2 is a cut-away side view at the wafer level in accord with a preferred embodiment of the invention.

FIG. 3 is a cut-away side view of an individual device of one preferred embodiment at the chip level of the invention.

FIG. 4 is a cut-away side view of another preferred embodiment at the chip level of the invention.

SUMMARY OF THE INVENTION

Figure 5:
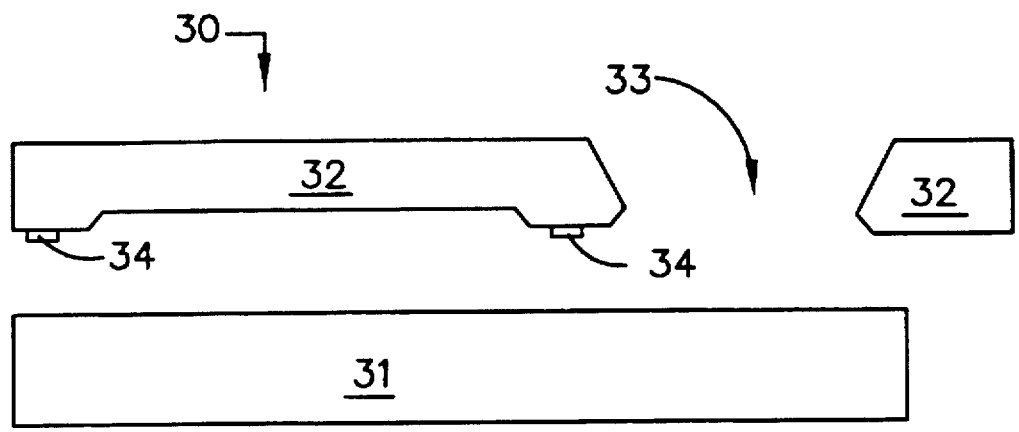
FIG. 5 is side view of two major components at the chip level of a preferred embodiment of the invention.

A construction technique and infrared device built thereby are described herein.

A wafer assembly having infrared devices (which can be detectors or emitters, either singly or in an array or arrays) provide for an inexpensive way of packaging infrared devices. The wafer is covered and maintained in a vacuum by a top cap of infrared transparent material spaced apart therefrom by a solder bead and farther from the structure of the top cap wafer in some instances.

In either case, the result is a minimally thermoconductive space between the top cap and the infrared devices, which can be evacuated or filled with minimally thermoconductive fluid or gas. The spacing can be provided by any or all of the solder bead; a recess in the top cap or an additional spacer layer of material added either to the bottom of the top cap or the upper surface of the infrared containing wafer.

In the preferred embodiment, the wafer assembly is then diced into its final chip components, each maintaining individual vacuum integrity. It is preferred that each vacuum cavity have an integral getter to increase the vacuum life of the component.

DETAILED DESCRIPTION OF THE PREFERRED EMBODIMENT

Referring first to FIG. 1, a wafer which will be used to create a set of devices in accord with a preferred embodiment of the invention is shown, being a wafer composed of many devices or chips 8, constructed thereon by prior processes not described here.

In FIG. 2, a cross-sectional view is taken of a wafer 9 like wafer 7 of FIG. 1, having a top cap wafer (9b) attached thereto. The top cap wafer (9b) should be an IR transparent wafer. When attached in a vacuum, all the devices on one wafer 9 are simultaneous sealed by the cap 9, in a highly efficient batch fabrication technique. The spacer material 11 both holds the wafers 9 and 9b apart and seals each individual chip or die 8, in its own area. The dashed lines shown at 12 around chip 84 show where the paired wafers would be diced to produce a chip based on the infrared device in area 84.

Referring now to FIG. 3, a device in accord with the preferred embodiment 10 is illustrated at the "device" or chip level, having two major component parts; a substrate or base chip 9 and a top cover 12. On the surface of the top cover 12 is an anti-reflective layer 13 and underneath its surface is a second anti reflective coating 14. (Substances used for anti-reflective coatings are well known.) The joining of the two halves in accord with this invention yields a space 21 between them. By sealing them together, preferably with a solder layer 16, 16a while the two halves are in a vacuum, the cavity 21 itself remains evacuated. The solder layer 16 can be applied by vacuum deposition and either lift-off or etch, or by masking and plating. The wafer or chip containing the microbolometers 20 and or other type (pyroelectric, thermoelectric, etc.) of thermal infrared sensitive devices, are manufactured first. Such manufacture is not a part of this patent and can be done in numerous known ways. There can be electronics 25 beneath the surface layer that provides some signal processing and/or switching properties which the infrared sensitive devices (20) will use. Generally, there is a layer 22 of electrical connections and the microbolometer 22a or other infrared sensitive or emitting devices. These electrical leads can be passivated (i.e., coated with a protective layer of material, for example, silicon nitride or other well known passivation material) such that the solder layer can be applied over them and form the vacuum seal without shorting the leads together. The leads terminate on pads 18 that wire bonds can be made on and connected to other circuitry off the infrared sensitive device.

The infrared sensitive elements 20 are usually thin film structures that are suspended above the chip surface for thermal isolation and such devices are very fragile in subsequent manufacturing steps. FIG. 3 illustrates devices where this thermal isolation is accomplished by etching away part of the substrate 22b. The top cap needs to be separated from the thermally isolated elements so as to not touch the elements and conduct heat towards or away from the elements. An effective way to assure a good cavity size is to etch a recess in the top cap surface 15. With this recess present extreme measures are not necessary to prevent the solder from being squeezed out causing the separation between pads 15a and 16 to become extremely small when the solder is molten and the wafers are pressed together. A metal layer 15a that the solder can wet to and to allow for the solder 16, 16a to be patterned on the top cap surface so as to form a ring or frame large enough to encircle the array of thermally isolated structures 20. A similar ring or frame of metal that the solder can wet to may also be preferably created on the wafer of detector/emitter die.

Two wafers are brought together in vacuum, using suitable wafer bonding equipment. Low levels of heat may be used for this processing step (solder usually reflows between 100–300° C. depending on type used, we presently prefer to use 50:50 InPb. The user may, of course, use any solder he/she prefers.) The die are sealed in vacuum and the fragile thermally isolated elements are protected from damage and debris associated with subsequent wafer sawing and die handling by the surrounding solder bead. Lines for wafer sawing 27, illustrate in one direction how die would be separated while maintaining the integrity of solder seal. (The top cap 12 should also have had its anti reflective layers 13 and 14 placed thereon before the joining of the two halves 12 and 11.)

Because the resultant package is only the thickness of two silicon wafers the result is a significant reduction in both the size and the weight of the package as compared to a standard vacuum package for similar devices. This aspect is important and desirable for almost all applications of infrared devices.

To ensure a low pressure is maintained within a micropackage (chip level vacuum cavity 21), it is useful to ensure that no materials which will excessively outgas lie within the micropackage. In addition, since the internal surfaces of the infrared die and overlying window or top cap will have at least a small outgassing rate, it may be necessary, or at least useful, to include small quantities of a specialized getter material within the micropackage. The function of the getter material is to absorb outgassants, which would otherwise cause an increase in the internal pressure of the micropackage and the resulting decrease of the thermal isolation of the IR detector or emitter elements.

Suitable getter materials are well known, such as thin films of barium, vanadium, iron, zirconium or their alloys. Before such materials can act as getters, they must be activated by heating to a high temperature for a short period.

To incorporate and activate small quantities of getter materials within a micropackage, the required mass of getter material may be deposited monolithically upon suitable regions of the infrared die or the top cap. Numerals 23 and 24 show locations where such monolithic getters may preferably be placed. The getter material may be either deposited directly upon these surfaces 24, or upon thermally isolated microbridges 23 of such materials as silicon nitride. An advantage of deposition upon a microbridge is that the thermal isolation property of the microbridge allows thermal activation of the getter material by a small heating power applied for a short time, for example by an electrical heating current or a beam of heating radiation as produced by an infrared laser, without requiring the adjacent parts of the infrared die or window to be heated significantly.

If the getter is on a thermally isolated structure, an alternate heating method may be to supply an electric current passed through a resistive heating element fabricated on the structure to heat the structure enough to activate the getter. To get electric power to the heater another solder pattern 23c can be produced at the same time as the solder ring 16, 16a to connect pads on the top cap 23a to pads on the device chip 23b. These pads 23b consist of a metal that solder can wet to and connect to leads 22 which will connect to pads 18 for wire bonding. A hole 26 through the top cap 12 over the pads allows access to the sealed devices for wirebonding. If desired, a large molecule or atomic gas, preferably non-reactive such as Xenon, maybe used instead of the vacuum or vacuum/getter filler. Xenon is known, for example, to be only one-fifth as thermally conductive as air. Currently, the evacuated space and getter combination is preferred, however.

For lowest cost the top cap 12 should preferably be comprised of single crystal silicon, with low absorption in the region of infrared detection or emission. This is material which is transparent to infrared radiation and easily obtainable.

Alternatively a window in the top cap wafer, or the top cap wafer itself, could be formed of a thin film of polycrystalline silicon or other materials such as germanium, GaAs, etc. with different degrees of transparency. Thus, if the structures at 20 are emitting structures, the infrared can be transmitted through the top cap 12 and, if they are receiving or detector structures, the infrared from the environment can be received into them also through top cap 12.

Referring now to FIG. 4, a substrate with infrared sensitive devices 44 is indicated by the numeral 41 and the device overall by the numeral 40. For very large arrays of infrared sensitive devices or thin windows in the top cap, the load of atmospheric pressure on the top cap and device chip can cause bowing such that the two inner surfaces can touch. At least one support post 43 may be added to cause the top cap to remain separated from the top cap 42 which in this embodiment is lengthened substantially without increasing its width. This permits the encapsulation of very large arrays or infrared sensitive structures which are substantially more useful in infrared imaging devices, such as cameras, for instance. FIG. 4 also shows another method that the top cap can be spaced apart from the thermally isolated elements. A standoff 45 of deposited material such as a metal can be patterned at the same time as the support post 43 thereby eliminating the need for the recess etch in the top cap surface. If desired, a metal that the solder can wet to can be patterned on top of the post for subsequent soldering operations.

In another alternative the getter could be placed on a thermally isolated structure on the detector/emitter die 47. Electrical connections to this getter for heating can be made as in the structure depicted in FIG. 3 with layers such as 22 and pads 18.

To further integrate the electronic portion of the system, electronic devices 48 could be fabricated in the top cap wafer and connections can be made to these devices in the same manner as the thermally isolated getter in FIG. 3 with pads 23a, 23b, solder 23c. Some of the benefits of placing electronics in the top cap are further size reduction, lower electrical noise due to shorter leads, and temperature matched very closely to the infrared sensitive die.

A layer of solder is preferable to all other structures known for this kind of bonding in a vacuum environment. However, ultrasonic pressure devices may also be used if properly constructed to push the entire post or pedestal structure against the surface of substrate 41 all at the same time.

A simple representation of the structure 30 is found in FIG. 5. In this case, a gap or hole 33 is made (in this case by etching) to provide for direct access to the bonding pads so that the infrared structures (not shown) in substrate 31 can have electrical access to the outside world. A layer of solder 34 is shown located on the underside of top cap 32 showing where such a solder layer might be located in a cold form for one preferred form of assembly.

Figure 6:
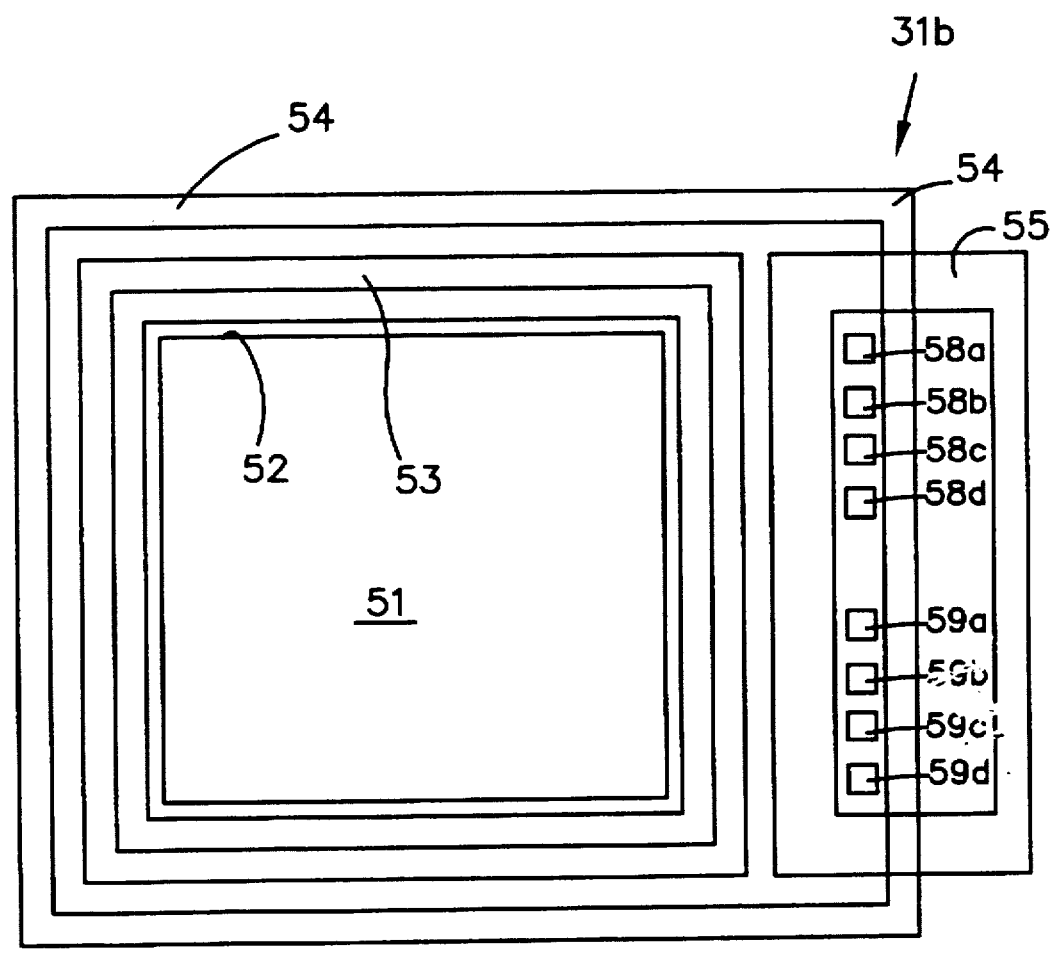
FIG. 6 is a top view of the surface patterning of the substrate layer (upper surface) at the chip level of a preferred embodiment of the invention.

Referring now to FIG. 6, the areas 51 through 59d of interest are illustrated on a surface 31. In the center of the set of structures is the area 51 in which the infrared 15 sensitive structures would be located. Area 52 indicates the region in which the top cap cavity edge would be located. Beyond this is area 53 in which the solder layer such as that shown in FIG. 5 (numeral 34) would be located. The outer edge 54 is also shown. Wire bonding pads 58a through 59d are shown within area 54. Area 55 describes the opening 33 as it may be situated when substrate 31 and top cap 32 are brought together for bonding. Thus, the bonding pads 58a through 59d would be available through opening 33.

This invention should not be considered limited in any respect except as set forth in the following claims.

What is claimed is:

1. A process of making infrared array packages from two wafers comprising:

a) evacuating a chamber contained by a top cap wafer having top cap dies and also containing an array wafer having array dies located so as to be pairable with said top cap dies;

b) physically bringing together the two wafers such that the paired arrays and the top caps are positioned so as to be sealable together;

c) sealing said wafers together;

d) dicing the paired dies.

2. A process as set forth in claim 1 wherein solder is applied to either the top cap wafer or the array wafer at some time prior to step c).

3. A process as set forth in claim 1 wherein the chamber is filled with a low thermal conductivity gas before step c).

4. A process as set forth in claim 1 wherein the sealing step employs ultrasonic bonding.

* * * * *